US010873993B2

(12) United States Patent
Cubon

(10) Patent No.: US 10,873,993 B2
(45) Date of Patent: Dec. 22, 2020

(54) SELF-REGULATING HEATING DEVICE

(71) Applicant: Horizons Incorporated, Cleveland, OH (US)

(72) Inventor: Michael M. Cubon, Park Ridge, IL (US)

(73) Assignee: TRAMEC TERMICO TECHNOLOGIES, L.L.C., Iola, KS (US)

(*) Notice: Subject to any disclaimer, the term of this patent is extended or adjusted under 35 U.S.C. 154(b) by 254 days.

(21) Appl. No.: 15/951,883

(22) Filed: Apr. 12, 2018

(65) Prior Publication Data

US 2018/0302952 A1 Oct. 18, 2018

Related U.S. Application Data

(60) Provisional application No. 62/484,506, filed on Apr. 12, 2017.

(51) Int. Cl.

| | |
|---|---|
| ***H05B 3/14*** | (2006.01) |
| ***H01L 31/024*** | (2014.01) |
| ***H05B 3/16*** | (2006.01) |
| ***H02S 40/30*** | (2014.01) |
| ***H05B 3/34*** | (2006.01) |

(52) U.S. Cl.

CPC ........... *H05B 3/146* (2013.01); *H01L 31/024* (2013.01); *H02S 40/30* (2014.12); *H05B 3/145* (2013.01); *H05B 3/16* (2013.01); *H05B 3/34* (2013.01); *H05B 2203/011* (2013.01); *H05B 2203/013* (2013.01); *H05B 2203/017* (2013.01); *H05B 2203/02* (2013.01)

(58) Field of Classification Search

CPC . H05B 3/146; H05B 3/34; H05B 3/16; H05B 3/145; H05B 3/20; H05B 3/345; H05B 3/347; H05B 2203/013; H05B 2203/017; H05B 2203/011; H05B 2203/02; H05B 2203/006; H05B 2214/04; H05B 2214/02; H02S 40/30; H02S 40/12; H02S 40/10; H02S 40/32; H02S 40/38; H02S 40/44; H02S 50/00; H01L 31/024; Y02E 10/50; F24S 40/20; F24S 40/70

See application file for complete search history.

(56) References Cited

U.S. PATENT DOCUMENTS

2009/0056244 A1* 3/2009 Caterina ................ A01G 13/06 52/169.11

2017/0231811 A1* 8/2017 Cubon ...................... A61F 7/02 607/110

* cited by examiner

*Primary Examiner* — Shawntina T Fuqua

(74) *Attorney, Agent, or Firm* — Tarolli, Sundheim, Covell & Tummino LLP

(57) ABSTRACT

A self regulating heating device includes a first layer made of an electrically insulating material. The first layer is thin and flexible. First and second buses spaced from each other are connected to the first layer. A resistive layer electrically connects the first and second buses. The resistive layer has a higher electrical resistance than the second layer. The resistive layer experiences a positive temperature coefficient (PTC) effect when heated. A solar active layer is connected to the first layer. The solar active layer is electrically connected to the first and second buses. The solar active layer converts light into electrical energy to apply a voltage across the first and second buses.

15 Claims, 4 Drawing Sheets

90 74 10 92 78 64 76 54 62 72 66 66 56 58 52 44 36 36 34 46 42 24 28 32 26 22 14 18 16 12

SELF-REGULATING HEATING DEVICE

RELATED APPLICATIONS

This application claims priority from U.S. Provisional Application Ser. No. 62/484,506, filed Apr. 12, 2017, the subject matter of which is incorporated herein by reference in its entirety.

FIELD OF THE INVENTION

The present invention relates to a self-regulating heating device and, more specifically, to a polymeric positive temperature coefficient (PTC) heater with a solar cell.

BACKGROUND OF THE INVENTION

A known heater designed to provide personal heating uses a heated wire or heated fabric to provide heat to the user. The known heaters use a fixed wattage method of providing conductive heat to the user. Generally, a fixed resistance heater is assembled to an article of clothing, such as footwear, gloves, hats, etc. that will be worn by the user. The heater can be a stitched wire, carbon fiber, or an etched heater pad. The heater receives power from a battery that must be carried in some way by the user. The known heater has a failure mode which could be hazardous to the user. Use of a fixed resistance heater requires a sensing device, such as a thermostat, to control the temperature. The sensing device measures the temperature of a single point of the heater and assumes that the rest of the heater is operating at the same temperature. In the event of a malfunction, or if the temperature is allowed to increase in other areas of the heater outside of the sensor, the heating device could produce a hazardous condition to the user.

SUMMARY OF THE INVENTION

The present invention is directed to a self regulating heating device including a first layer made of an electrically insulating material. The first layer is thin and flexible. First and second buses spaced from each other are connected to the first layer. A resistive layer electrically connects the first and second buses. The resistive layer has a higher electrical resistance than the second layer. The resistive layer experiences a positive temperature coefficient (PTC) effect when heated. A solar active layer is connected to the first layer. The solar active layer is electrically connected to the first and second buses. The solar active layer converts light into electrical energy to apply a voltage across the first and second buses self regulating heater including a first layer made of a thin and flexible electrically insulating material.

BRIEF DESCRIPTION OF THE DRAWINGS

The foregoing and other features and advantages of the present invention will become apparent to one skilled in the art upon consideration of the following description of the invention and the accompanying drawings, in which.

DETAILED DESCRIPTION

Figure 1:
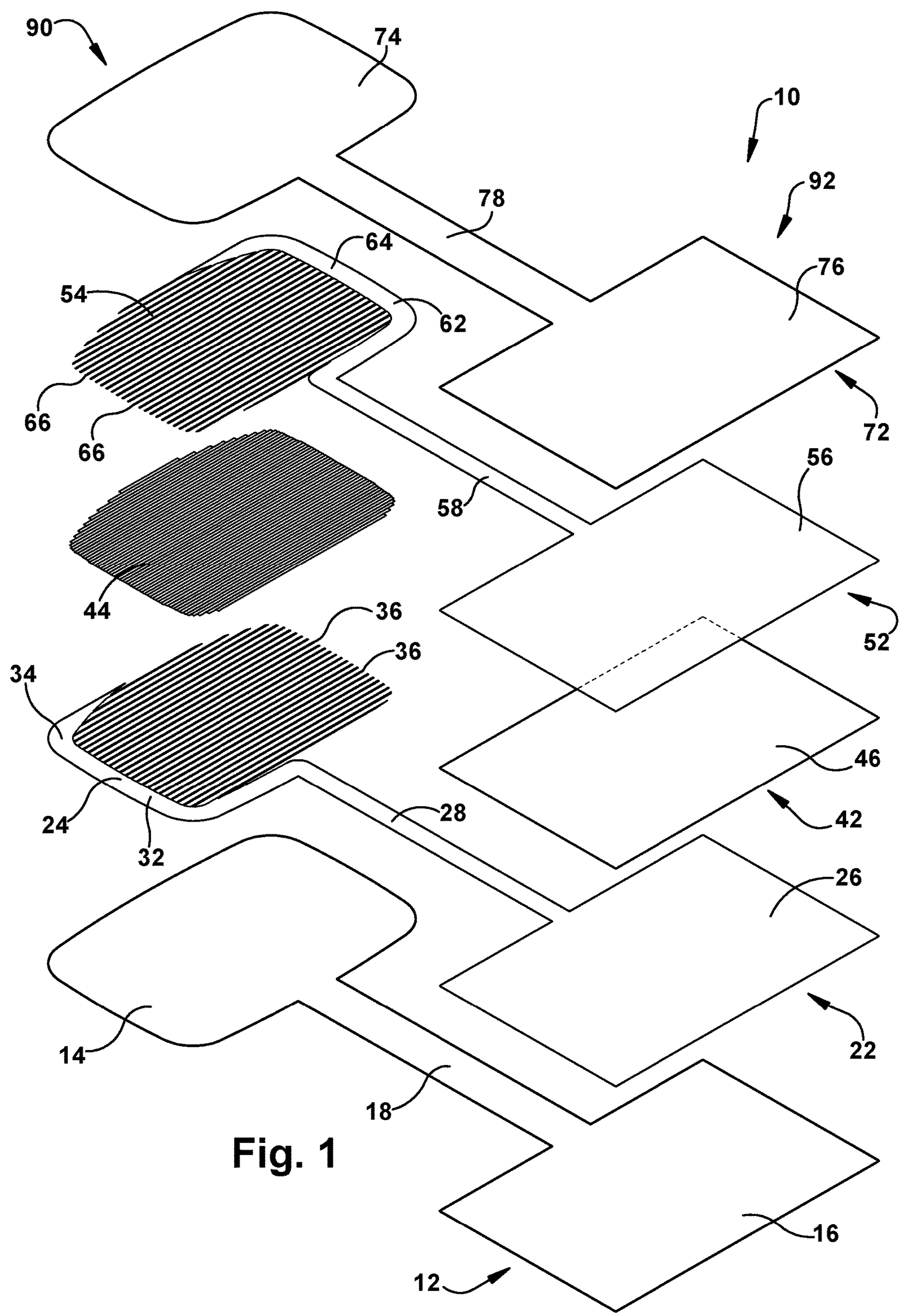
FIG. 1 is a schematic exploded view of a first embodiment of a self-regulating heating device constructed in accordance with the present invention.

FIG. 1 illustrates a self-regulating heating device 10 made in accordance with the present invention. The heating device 10 includes a first layer or substrate 12 made of an electrically insulating material. The first layer 12 may be relatively thin and flexible. Preferably, the first layer 12 is a film substrate made of any desired electrically insulating material such as polyethylene terephthalate (PET) or Mylar. It is contemplated that the first layer may be made of a polyimide or thermoplastic polyurethane (TPU). The first layer 12 may have a first portion 14 and a second portion 16 spaced from the first portion. A connecting portion 18 may extend between and interconnect the first and second portions 14, 16 of the first layer 12.

A second or electrically conductive layer 22 made of an electrically conductive material is connected to the first layer 12 and engages the first layer. The second layer 22 may be made of a flexible polymeric ink or silver. The second layer 22 may be connected to the first layer 12 in any desired manner and is preferably screen printed on the first layer. The second layer 22 may be connected to the first layer 12 by close tolerance screen printing, digital printing, inkjet printing, flexographic printing, or gravure printing.

The second or conductive layer 22 may have a first portion 24 and a second portion 26 spaced from the first portion. A connecting portion 28 may extend between and interconnect the first and second portions 24, 26 of the second layer 22. The first portion 24 of the second layer may be connected to the first portion 14 of the first layer 12. The second portion 26 of the second layer 22 may be connected to the second portion 16 of the first layer 12. The connecting portion 28 of the second layer 22 may be connected to the connecting portion 18 of the first layer 12.

The first portion 24 of the second layer 22 includes at least one bus 32. The bus 32 may include a base 34 having a relatively large width. The base 34 may extend along a portion of an outer edge of the first portion 24 of the second layer 22. Although the base 34 is described as extending along an outer edge of the first portion 24 of the second layer 22, it is contemplated that the base may extend in any desired direction.

The bus 32 may include finger portions 36 extending from the base 34 and generally perpendicular to the connecting portion 28 of the second layer 22. The finger portions 36 may extend generally parallel to each other. The finger portions 36 may have a width substantially smaller than the width of the base 34. Although the finger portions 36 are described as extending generally parallel to each other, it is contemplated that the finger portions may extend in any desired direction. Although the bus 32 is described as having a specific shape, it is contemplated that the bus 32 may have any desired shape. The second portion 26 and the connecting portion 28 of the second layer 22 are part of the bus 32.

A third layer 42 may have a first portion 44 and a second portion 46 spaced from the first portion 44. The first portion 44 is a resistive portion that experiences a positive temperature coefficient (PTC) effect when heated. The first portion 44 of the third layer is connected to the first portion 24 of the second or conductive layer 22. The first portion 44 of the third layer 42 has a higher electrical resistance than the first portion 24 of the second layer 22. The second portion 46 of the third layer is a solar active portion made of solar sensitive materials or photovoltaic materials such as titanium oxide and/or silicon. The second portion 46 of the third layer is connected to the second portion 26 of the second layer 22.

The first portion 44 of the third layer 42 engages the first portion 24 of the second layer 22. The second portion 46 of the third layer 42 engages the second portion 26 of the second layer 22. The first and second portions 44, 46 of the third layer 42 may be connected to the first and second portions 24, 26 of the second layer 22 in any desired manner and are preferably screen printed on the second layer. The third layer 42 is connected to the second layer 22 so that the second layer is between the third layer and the first layer 12.

A fourth or electrically conductive layer 52 made of an electrically conductive material is connected to the third layer 42 and engages the third layer. The fourth layer 52 is generally similar to the second layer 22 and may be made of a flexible polymeric ink or silver. The fourth layer 52 may be connected to the third layer 42 in any desired manner and is preferably screen printed on the third layer. The fourth layer 52 may be connected to the third layer 42 by close tolerance screen printing, digital printing, inkjet printing, flexographic printing, or gravure printing.

The fourth layer 52 may have a first portion 54 and a second portion 56 spaced from the first portion. A connecting portion 58 may extend between and interconnect the first and second portions 54, 56 of the fourth layer 52. The first portion 54 of the fourth layer may be connected to the first portion 44 of the third layer 42. The second portion 56 of the fourth layer 52 may be connected to the second portion 46 of the third layer 42. The connecting portion 58 of the fourth layer 52 may be spaced from the connecting portion 28 of the second layer 22 and connected to the connecting portion 18 of the first layer 12.

The first portion 54 of the fourth layer includes at least one bus 62. The bus 62 may include a base 64 having a relatively large width. The base 64 may extend along a portion of an outer edge of the first portion 54 of the fourth layer 52. Although the base 64 is described as extending along an outer edge of the first portion 54 of the fourth layer 52, it is contemplated that the base may extend in any desired direction.

The bus 62 may include a plurality of finger portions 66 extending from the base 64 and generally perpendicular to the connecting portion 58 of the fourth layer 52. The finger portions 66 may extend generally parallel to each other and the finger portions 36 of the first portion 24 of the second layer 22. The finger portions 66 may have a width substantially smaller than the width of the base 64. Although the finger portions 66 are described as extending generally parallel to each other and the finger portions 36, it is contemplated that the finger portions 66 may extend in any desired direction. Although the bus 62 is described as having a specific shape, it is contemplated that the bus 62 may have any desired shape. The second portion 56 and the connecting portion 58 of the fourth layer 52 are part of the bus 62.

The buses 32 and 62 are spaced from each other and the first portion 44 of the third layer 42 electrically connects the buses 32 and 62. The patterns of the buses 32, 62 determine the watt density of the heating device 10. The finger portions 36 and 66 may extend generally between each other and parallel to each other. The first portion 44 of the third layer 42 generates heat when a voltage is applied across the buses 32, 62. The first portion 44 of the third layer 42 includes a conductive carbon black filler material dispersed in a polymer that has a crystalline structure. The crystalline structure densely packs the carbon particles into a crystalline boundary so the carbon particles are close enough together to allow electrical current to flow through the polymer insulator via these carbon "chains" between the first and second buses 32 and 62. When the polymer is at normal room temperature, there are numerous carbon chains forming conductive paths through the material. Heat is produced when current flows through the polymeric device. Heating causes the temperature of the polymer to rise. As the heating continues, the temperature of the material continues to rise until it exceeds a phase transformation temperature. As the material passes through the phase transformation temperature, the densely packed crystalline polymer matrix changes to an amorphous structure. The phase change is accompanied by an expansion of the polymer. As the conductive particles move apart from each other, most of them no longer conduct current and the resistance of the heating device 10 increases sharply. The heating device 10 will reach a designed steady state temperature and will draw reduced amperage to maintain the steady state temperature. The heating device 10 will stay "warm", remaining in this high resistance state as long as the power is applied. Removing the power source will reverse the phase transformation and allow the carbon chains to re-form as the polymer re-crystallizes. The heater resistance returns to its original value.

A fifth layer 72 is directly connected to the fourth layer 52 so that the fifth layer engages the fourth layer. The fifth layer is generally similar to the first layer and is made of an electrically insulating material. The fifth layer 72 is transparent and may be relatively thin and flexible. Preferably, the fifth layer 72 is a transparent film made of any desired electrically insulating material such as polyethylene terephthalate (PET) or Mylar. The fifth layer 72 may have a first portion 74 and a second portion 76 spaced from the first portion. A connecting portion 78 may extend between and interconnect the first and second portions 74, 76 of the fifth layer 72. The first portion 74 of the fifth layer 72 may be connected to the first portion 54 of the fourth layer 52. The second portion 76 of the fifth layer 72 may be connected to the second portion 56 of the fourth layer 52. The connecting portion 78 of the fifth layer 72 may be connected to the connecting portion 58 of the fourth layer 52, the connecting portion 28 of the second layer 22 and the connecting portion 18 of the first layer 12. The fifth layer 72 may be a film that completely seals the heating device 10.

The first portions 14, 24, 44, 54 and 74 of the layers 12, 22, 42, 52, and 72 form a self-regulating heater 90. The second portions 16, 26, 46, 56 and 76 of the layers 12, 22, 42, 52, and 72 form a solar cell or battery 92 for providing power to the heater 90. The solar cell 92 converts energy from light into electrical energy to power the heater 90. The solar cell 92 applies a voltage across the buses 32, 62 through the connection portions 28, 58.

The heating device 10 may be attached to and/or placed in clothing to provide heating to a desired temperature. The heating device 10 may be attached to the clothing so that the solar cell 92 receives light to power the heater 90. The self-regulating heating device 10 may be connected to a sleeve, sock, or a glove that a person can wear. The PTC heater 90 may be attached to a palm side of the glove and the solar cell may be attached to a back hand side of the glove. The self-regulating heater 10 may be attached to a shirt, pants, hat, scarf, blanket, boot or any other wearable device. The heating device 10 may conform to body parts of a person because the thickness is controlled. The heating device 10 is very flexible and may be folded upon itself due to the thickness. The heating device 10 may have many different configurations that can include variable watt densities and unlimited shapes and sizes that can provide self-regulating heat. The heating device 10 may include slots and holes that allow the heater to be wrapped around contours of the body.

The design flexibility of the heating device 10 allows for a myriad of shapes and sizes to keep the temperature difference across the heating device 10 as low as possible and at most 4° F. It is also contemplated that the fingers 36, 66 and bases 34, 64 may be located closer to each other in predetermined areas of the heating device 10 to increase the watt density of the heater in the predetermined areas. For example, the heating device 10 may be attached to a glove and have the shape of a hand with a palm portion and finger engaging portions. The fingers 36, 66 and bases 34, 64 of the buses 32, 62 located in the finger engaging portions of the heating device 10 may be spaced from each other a smaller distance that the fingers and bases located in the palm engaging portion of the heater. Therefore, the watt density of the heating device 10 in the finger engaging portions would be greater than the watt density of the heater in the palm engaging portion and the finger engaging portions would have a higher steady state temperature than the palm engaging portion.

The process of forming the heating device 10 includes close-tolerance screen printing in a controlled environment. The process for forming the heating device 10 also includes laminating and curing processes that completely stabilize the part.

Figure 2:
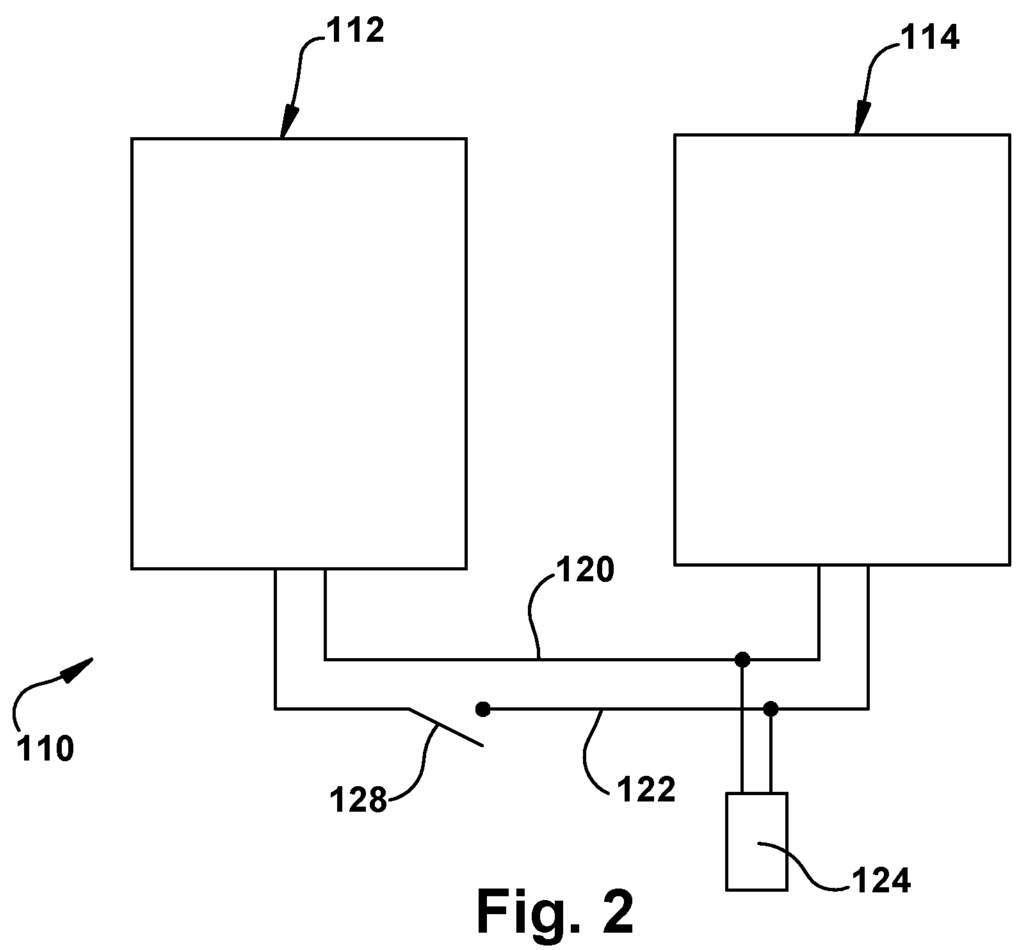
FIG. 2 is a schematic plan view of a second embodiment of a self-regulating heating device constructed in accordance with the present invention.

A self-regulating heating device 110 constructed in accordance with a second embodiment is illustrated in FIG. 2. The heating device 110 may be generally similar to the heating device 10 illustrated in FIG. 1. The heating device 110 may include a heater 112 similar to the heater 90 of FIG. 1 and a solar cell 114 similar to the solar cell 92 of FIG. 1. The heater 112 and the solar cell 114 are connected to each other by electrical conductors 120, 122. The solar cell 114 powers the heater 112 through the conductors 120, 122.

The heating device 110 may include a battery 124. The battery 124 may be a rechargeable battery. The battery 124 has a first terminal that is connected to the conductor 120 and a second terminal connected to the second conductor 122. The battery 124 may be charged by the solar cell 114 and provide power to the heater 112 when the solar cell cannot provide power. Also the heating device 110 may include a switch 128. The switch 128 may be used to prevent power from being transferred from the solar cell 114 and/or the battery 124 to the heater 112. When the switch 128 is closed, power from the solar cell 114 and/or the battery 124 may be provided to the heater 112.

Figure 3:
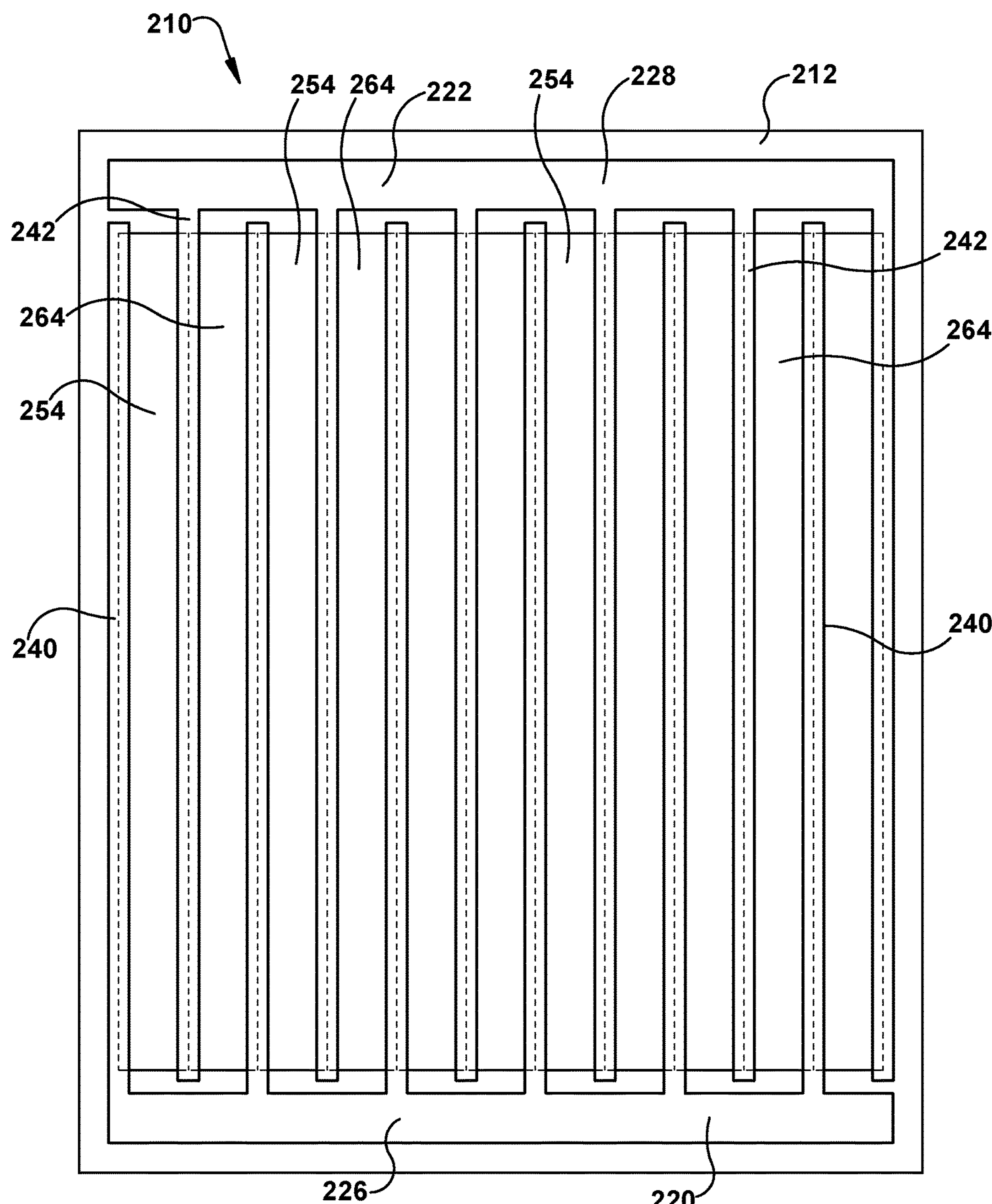
FIG. 3 is a schematic plan view of another embodiment of a self-regulating heating device constructed in accordance with the present invention.
Figure 4:
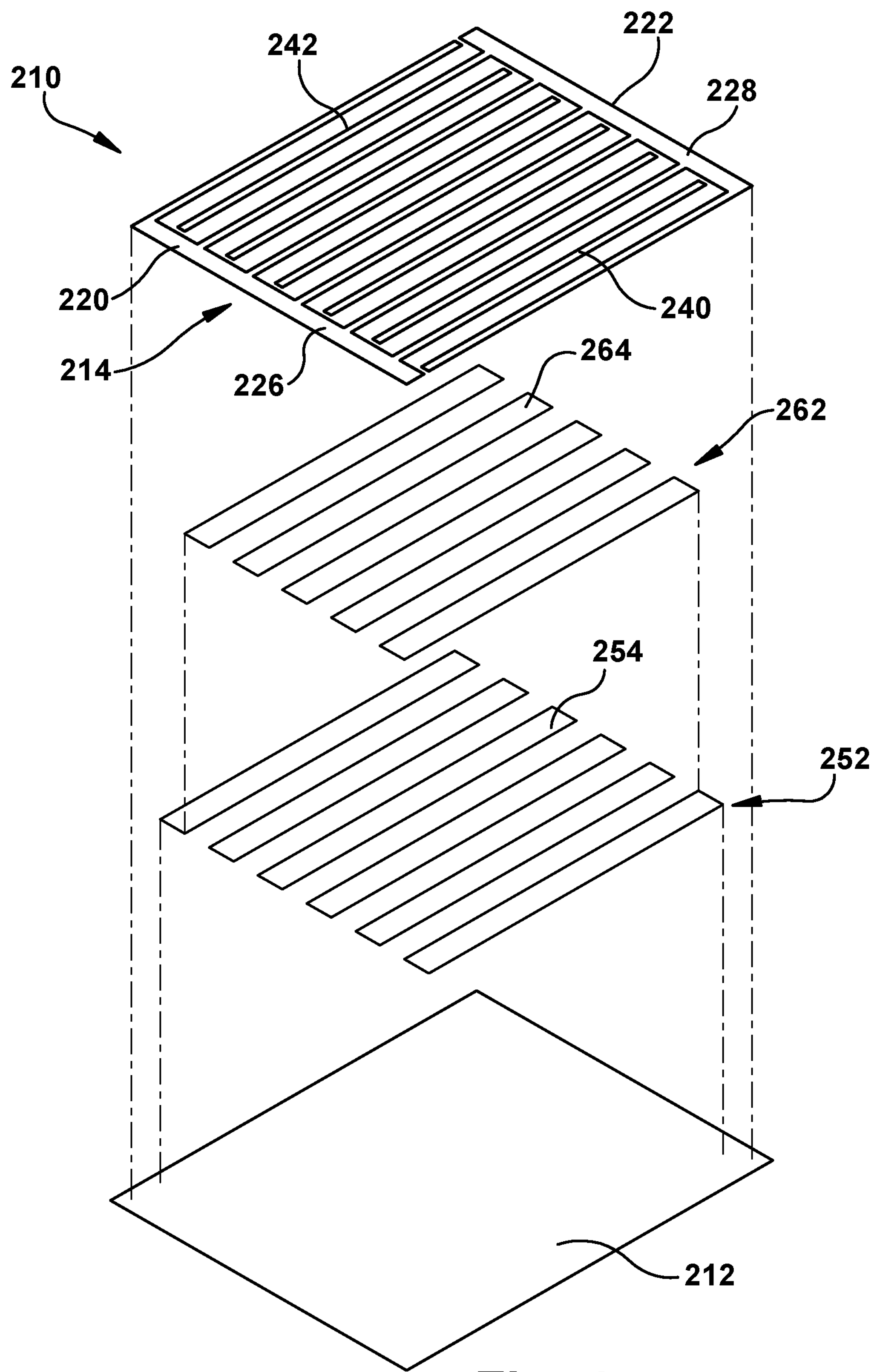
FIG. 4 is a schematic exploded view the self-regulating heating device of FIG. 3.

Another embodiment of a self-regulating heating device 210 is illustrated in FIGS. 3-4. The heating device 210 includes a first layer or substrate 212 made of an electrically insulating material. The first layer 212 may be relatively thin and flexible. Preferably, the first layer 212 is a film substrate made of any desired electrically insulating material such as a PET or Mylar.

An electrically conductive layer 214 made of an electrically conductive material is connected to the first layer 212 and engages the first layer. The conductive layer 214 may be made of a flexible polymeric ink or silver. The conductiver layer 214 may be connected to the first layer 212 in any desired manner and is preferably screen printed on the first layer. The conductive layer 214 may be connected to the first layer 212 by close tolerance screen printing, digital printing, inkjet printing, flexographic printing, or gravure printing.

The conductive layer 214 includes at least two buses 220 and 222 spaced from each other. The patterns of the buses 220, 222 determine the watt density of the heating device 210. The buses 220 and 222 may include bases 226 and 228 having a relatively large width. The bases 226 and 228 may extend generally parallel to each other. Although the bases 226, 228 are shown extending in a straight line, it is contemplated that the bases may extend in any desired direction.

The buses 220 and 222 may include a plurality of finger portions 240 and 242 extending from the bases 226, 228. Each of the busses 220 and 222 is shown having six finger portions 240, 242. However, it is contemplated that each of the busses 220, 222 may have any desired number of finger portions 240, 242. The finger portions 240, 242 may extend generally perpendicular to the bases 226, 228. The finger portions 240 and 242 may extend generally between each other and parallel to each other. The finger portions 240 and 242 may have a width substantially smaller than the width of the bases 226 and 228. Although the finger portions 240, 242 are described as extending generally perpendicular to the bases 226, 228, it is contemplated that the finger portions may extend in any desired direction. Although the buses 220, 222 are described as having a specific shape, it is contemplated that the buses 220, 222 may have any desired shape.

A resistive layer 252 that experiences a positive temperature coefficient (PTC) effect when heated is connected to the conductive layer 214 and the first layer 212. The resistive layer 252 engages the second layer 214. The resistive layer 252 may be connected to the first layer 212 in any desired manner and is preferably screen printed on the first layer. The resistive layer 252 is connected to the first layer 212 so that the resistive layer is between the conductive layer 214 and the first layer 212. The resistive layer 252 electrically connects the buses 220 and 222 of the conductive layer 214. The resistive layer 252 has a higher electrical resistance than the conductive layer 214. The resistive layer 252 generates heat when a voltage is applied across the buses 220, 222.

The resistive layer 252 includes a plurality of resistive strips 254. The resistive layer 252 is shown having six resistive strips 254. However, it is contemplated that the resistive layer 252 may have any desired number of resistive strips 254. Each of the strips 254 engages at least one finger portion 240 on the bus 220 and one finger portion 242 on the bus 222. Each of the strips 254 is made of conductive carbon black filler material dispersed in a polymer that has a crystalline structure. Heat is produced when current flows through the polymeric device. Heating causes the temperature of the polymer to rise. As the heating continues, the temperature of the material continues to rise until it exceeds a phase transformation temperature. As the material passes through the phase transformation temperature, the densely packed crystalline polymer matrix changes to an amorphous structure. The phase change is accompanied by an expansion of the polymer. The heating device 210 will reach a designed steady state temperature and will draw reduced amperage to maintain the steady state temperature. The heating device 210 will stay "warm", remaining in this high resistance state as long as the power is applied. Removing the power source will reverse the phase transformation and allow the carbon chains to re-form as the polymer re-crystallizes. The heater resistance returns to its original value.

A solar active layer 262 made of solar sensitive materials or photovoltaic materials such as titanium oxide and/or silicon is connected with the first layer 212. The solar active layer 262 may be connected to the first layer 212 in any desired manner and is preferably screen printed on the first layer. The solar active layer 262 is connected to the first 212 so that the solar active layer is between the conductive layer 222 and the first layer 212. The solar active layer 262 is electrically connected to the buses 220 and 222 of the conductive layer 214.

The solar active layer 262 includes a plurality of solar active strips 264. The solar active layer 262 is shown having five solar active strips 264. However, it is contemplated that the solar active layer 262 may have any desired number of solar active strips 264. Each of the strips 264 engages at least one finger portion 240 on the bus 220 and one finger portion 242 on the bus 222. The strips 254 and 264 may extend generally between each other and parallel to each other so that the strips 254, 264 alternate. Each of the strips 264 is made of solar sensitive materials or photovoltaic materials such as titanium oxide and/or silicon.

Although the heating device 210 has been described as having the conductive layer connected to the first or substrate layer and the resistive layer being connected to the first layer with the resistive layer between the first layer and the conductive layer, the conductive layer may be located between the resistive layer and the first or substrate layer.

It is contemplated that the PTC heater may be printed on one side of the first layer or film and the printed solar cell on the opposite side of the first layer or film. The electrical connection between the heater and solar cell may be created by drawing ink from one side of the film to the other side, through a small hole. The electrical connection can also be made with a rivet or with a crimp style conductor. The heaters 10, 110, and 210 have been described as being used for attachment to clothing. It is contemplated that the heaters could be used as seat heaters or any other desired use.

From the above description of the invention, those skilled in the art will perceive improvements, changes and modifications. Such improvements, changes, and/or modifications within the skill of the art are intended to be covered by the appended claims.

Having described the invention, the following is claimed:

1. A self regulating heating device comprising:

a first layer made of an electrically insulating material, the first layer being thin and flexible;

first and second buses spaced from each other and connected to the first layer;

a resistive layer electrically connected to the first and second buses, the resistive layer having a higher electrical resistance than the first and second buses, the resistive layer experiencing a positive temperature coefficient (PTC) effect when heated; and a solar active layer connected to the first layer, the solar active layer being electrically connected to the first and second buses, the solar active layer converting light into electrical energy to apply a voltage across the first and second buses.

2. The self regulating heating device of claim 1 wherein the first and second buses are screen printed flexible polymeric ink.

3. The self regulating heating device of claim 1 wherein the resistive layer is screen printed on at least one of the first and second buses.

4. The self regulating heating device of claim 1 wherein the resistive layer includes a conductive carbon black filler material dispersed in a polymer having a crystalline structure.

5. The self regulating heating device of claim 1 wherein the solar active layer is screen printed on at least one of the first and second buses.

6. The self regulating heater of claim 1 wherein each of the first and second buses includes a base and finger portions, the finger portions having a width substantially smaller than the width of each of the bases.

7. The self regulating heating device of claim 1 wherein the first bus is a first portion of a second layer connected to the first layer, the second layer having a second portion connected to a second portion of the first layer and a connecting portion interconnecting the first portion and the second portion of the second layer.

8. The self regulating heating device of claim 7 wherein the resistive layer is connected to the first portion of a second layer and the solar active layer is connected to a second portion of the second layer.

9. The self regulating heating device of claim 8 wherein the second bus is a first portion of a fourth layer connected to the resistive layer, the fourth layer having a second portion connected to the solar active layer and a connecting portion interconnecting the first portion and the second portion of the fourth layer, the connecting portion of the fourth layer being space from the connecting portion of the second layer.

10. The self regulating heating device of claim 9 wherein a fifth layer is connected to the second bus, the second portion of the fourth layer and the connecting portion of the fourth layer to seal the heating device.

11. The self regulating heating device of claim 1 wherein the resistive layer includes a plurality of resistive strips, each of the resistive strips engaging the first bus and the second bus, the solar active layer including a plurality of solar active strips, each of the solar active strips engaging the first bus and the second bus.

12. The self regulating heating device of claim 11 wherein the first includes a plurality of finger portions and the second bus includes a plurality of finger portions spaced from the finger portions of the first bus, each of the resistive strips engaging at least one of the finger portions of the first bus and at least one of the finger portions of the second bus, each of the solar active strips engaging at least one of the finger portions of the first bus and at least one of the finger portions of the second bus.

13. The self regulating heating device of claim 11 wherein the resistive strips extend generally parallel to the solar active strips at alternate with the resistive strips.

14. The self regulating heating device of claim 1 wherein the first and second buses and the resistive layer form a heater and the first and second buses and the solar active layer form a solar cell, the heater and the solar cell being connected by conductors, a battery being connected to the conductors to apply power to the heater when the solar cell cannot.

15. The self regulating heating device of claim 1 wherein the first and second buses and the resistive layer form a heater and the first and second buses and the solar active layer form a solar cell, the heater and the solar cell being connected by conductors, a switch being connected to at least one of the conductors to prevent the solar cell from applying power to the heater when the switch is open.

* * * * *